United States Patent
Kanazawa et al.

(10) Patent No.: US 6,859,376 B2
(45) Date of Patent: Feb. 22, 2005

(54) SIGNAL DETECTION CIRCUIT FOR DETECTING MULTIPLE MATCH IN ARRANGED SIGNAL LINES

(75) Inventors: Naoki Kanazawa, Chiba (JP); Ryuichi Hata, Chiba (JP)

(73) Assignee: Kawasaki Microelectronics, Inc., Chiba (JP)

( * ) Notice: Subject to any disclaimer, the term of this patent is extended or adjusted under 35 U.S.C. 154(b) by 0 days.

(21) Appl. No.: 10/372,230

(22) Filed: Feb. 25, 2003

(65) Prior Publication Data

US 2003/0169613 A1 Sep. 11, 2003

(30) Foreign Application Priority Data

Feb. 27, 2002 (JP) ........................................ 2002-051688

(51) Int. Cl.[7] .............................................. G11C 15/00
(52) U.S. Cl. ........................ 365/49; 365/191; 365/233.5
(58) Field of Search ...................... 365/49, 191, 233.5; 711/108

(56) References Cited

U.S. PATENT DOCUMENTS

| | | | |
|---|---|---|---|
| 5,454,094 A | 9/1995 | Montove | |
| 6,307,767 B1 | 10/2001 | Fuh | |
| 6,392,910 B1 | * 5/2002 | Podaima et al. | ............... 365/49 |
| 6,393,514 B1 | * 5/2002 | Khanna et al. | ............. 711/108 |

FOREIGN PATENT DOCUMENTS

| | | |
|---|---|---|
| JP | A 5-174582 | 7/1993 |
| JP | A 6-89588 | 3/1994 |
| JP | A 6-111584 | 4/1994 |
| JP | A 6-231588 | 8/1994 |
| JP | A 7-153279 | 6/1995 |
| JP | A 2001-256787 | 9/2001 |

* cited by examiner

*Primary Examiner*—David Lam
(74) *Attorney, Agent, or Firm*—Oliff & Berridge, PLC

(57) ABSTRACT

A signal detection circuit detects the presence or absence of signals having the same logic in a plurality of arranged signal lines, can be used as a circuit suitable for multi-hit detection in a content addressable memory. The signal detection circuit includes a first signal transmission line to transmit a first signal indicating the presence of two or more logical signals to be detected and a second signal transmission line to transmit a second signal indicating the presence of one or more of the logic signals to be detected. Each of the first and second signal transmission lines includes logic circuits. The signal detection circuit may have a hierarchical structure.

11 Claims, 8 Drawing Sheets

SIGNAL DETECTION CIRCUIT FOR DETECTING MULTIPLE MATCH IN ARRANGED SIGNAL LINES

BACKGROUND OF THE INVENTION

1. Field of the Invention

The present invention relates to signal detection circuits for detecting whether there are signals having the same logic in a plurality of arranged signal lines, and more particularly pertains to a signal detection circuit suitable for multi-hit detection in a content addressable memory.

2. Description of the Related Art

Hitherto, a signal detection circuit built in a content addressable memory (hereinbelow, abbreviated and referred to a CAM) has been used for multi-hit detection. Data stored in CAM words is searched using a search key data. A signal indicating that the stored data has matched the search key data is called a hit flag. The signal detection circuit detects whether there are hit flags in a plurality of word match lines arranged in the CAM (the presence of the hit flags in the match lines is called multi-hit). A signal detection circuit comprising AND gates is known as one of the above-mentioned signal detection circuits. In this signal detection circuit, sense outputs of two arbitrary match lines are supplied to one of a plurality of 2-input AND gates to determine the logic between the sense outputs, and the outputs of the plurality of 2-input AND gates are input to at least one OR gate, thus detecting the presence or absence of multi-hit. The number of combinations of AND gates in the signal detection circuit is determined by the number of match lines. In order to detect multi-hit among several hundreds of match lines, the scale of the circuit must be enormously increased. To overcome such a disadvantage, Japanese Patent Application Publication No. 6-231588 (corresponding to U.S. Pat. Nos. 5,726,942 and 5,999,434) proposes a technique of detecting multi-hit using a dynamic circuit.

FIG. 8 shows a signal detection circuit disclosed in this prior art.

Referring to FIG. 8, a signal detection circuit 100 is built in a CAM. This circuit 100 includes a sense amplifier 110. The sense amplifier 110 comprises PMOS transistors 111, 112, 113, and 114, NMOS transistors 115, 116, 117, and 118, and inverters 119_1 and 119_2.

This circuit 100 further includes a precharge circuit 120, a reference circuit 130, and detection circuits 140. The precharge circuit 120 comprises PMOS transistors 121, 122, and 123, of which the respective gates are connected commonly to each other. The reference circuit 130 comprises an NMOS transistor 131, of which the gate is connected to ground, and an NMOS transistor 132, of which the gate is connected to a power supply. Each detection circuit 140 comprises an NMOS transistor 141 in which a hit flag signal HF is input to the gate, and an NMOS transistor 142, of which the gate is connected to ground. The precharge circuit 120, the reference circuit 130, and the detection circuits 140 are connected to the sense amplifier 110 through a sense line 151 and a reference line 152. The size (gate width w) of each of the NMOS transistors 131 and 132 in the reference circuit 130 is substantially 1.5 times as large as that of each of the NMOS transistors 141 and 142 in the detection circuit 140.

The signal detection circuit 100 further includes inverters 161, 162, 163, 164, and 166, a NAND gate 165, an NMOS transistor 167, and a wired OR line 168.

In the signal detection circuit 100 with the above-mentioned structure, in order to search data stored in CAM words to detect multi-hit, a control signal CNT is first set to a level "H" (high). Consequently, the PMOS transistors 121, 122, and 123 of the precharge circuit 120 are turned on, thus precharging the sense line 151 and the reference line 152 and equalizing the potentials of these lines with each other to a power supply potential. The control signal CNT at the level "H" is changed to a level "L" (low) through the inverter 161. The control signal CNT at the level "L" is supplied to the respective gates of the PMOS transistors 111 and 114 in the sense amplifier 110. Thus, the PMOS transistors 111 and 114 are turned on. Consequently, a node between the PMOS transistor 111 and the NMOS transistor 116 and a node between the PMOS transistor 114 and the NMOS transistor 117 are also held to the power supply potential.

A search is then performed. As the result of the search, if the CAM word is not hit, a hit flag signal HF at the level "L" is input to the NMOS transistor 141 of the detection circuit 140. Therefore, both of the NMOS transistors 141 and 142 are in the OFF state.

Simultaneously with the input of the hit flag signal HF to the detection circuit 140, the control signal CNT is changed from the level "H" to the level "L". After that, a node between the NMOS transistors 131 and 132 in the reference circuit 130 goes to the level "L". Since the gate of the NMOS transistor 132 is connected to the power supply, the NMOS transistor 132 is turned on, thus discharging the reference line 152.

As the result of the search, if the search key data has hit only data stored in one CAM word, a hit flag signal HF at the level "H" is input to the NMOS transistor 141 of either of the detection circuits 140. Consequently, the NMOS transistor 141 is turned on, thus discharging the sense line 151. Since the size (gate width w) of the NMOS transistor 132 is substantially 1.5 times as large as that of the NMOS transistor 141, the discharge rate of the reference line 152 is higher than that of the sense line 151.

In this instance, when search key data hits data stored in two CAM words, the NMOS transistors 141 of the two detection circuits 140 are turned on. Since the two NMOS transistors 141 are in the ON state, the discharge rate of the sense line 151 is higher than that of the reference line 152. In other words, the potential gradient during the discharge of the sense line 151 and that during the discharge of the reference line 152 vary in some cases, namely, when there is no hit, when one hit is detected, and when two hits are detected. Therefore, a difference between the potentials is amplified by the sense amplifier 110 and the amplified output is then generated through the NAND gate 165, the inverter 166, and the NMOS transistor 167. In the case of two hits or more, an output at the level "H" is generated from the sense amplifier 110, thus finally turning the NMOS transistor 167 on. Consequently, the potential of the wired OR line 168 indicating the presence of multi-hit goes to the level "L". As mentioned above, the signal detection circuit 100 detects the presence or absence of multi-hit.

In recent years, the number of entries (the number of words) in the CAM is becoming increasingly larger. In the conventional signal detection circuit 100 shown in FIG. 8, as the number of entries increases, the length of the sense line and that of the reference line are increased and the number of discharging transistors connected to the sense line is also increased. Disadvantageously, a malfunction may occur due to the following causes.

For the first cause, as the load capacity of the sense line and that of the reference line increase, the discharge rate of the sense line and that of the reference line deteriorate. Consequently, a difference between the potentials of the sense and reference lines at the sensing point of the sense amplifier relatively decreases.

For the second cause, since the respective lengths of the sense line and the reference line increase, the lines are susceptible to ambient noises. Particularly, in the CAM, since current consumption is large and a peak current is high in the search operation, the power supply potential and a ground potential vary excessively. In recent years, since a power supply voltage is becoming lower, the CAM is susceptible to noises caused by the variations.

To avoid malfunctions caused by the first and second causes, the following signal detection circuit is proposed. In the signal detection circuit, the length of each of the sense line and the reference line is reduced and the number of discharging transistors connected to the sense line is also reduced. In other words, a section to detect multi-hit is divided into small unit groups. However, when the respective lengths of the sense line and the reference line are short, the respective discharge rates becomes higher, resulting in a small difference between the potential of the sense line and that of the reference line. Accordingly, it is difficult to control the signal detection circuit.

Since the detection section is divided into small unit groups, the number of sense amplifiers is increased, and the area of the signal detection circuit also increases in the CAM. This results in an increase in the area of a semiconductor chip including the CAM. Further, since the section is divided into small unit groups, layout design is complicated.

Furthermore, recent finer semiconductor processing results in an increase in the sheet resistance of a metal film and an increase in the resistance of a via hole. Accordingly, the circuit is extremely sensitive to the symmetry of layout.

SUMMARY OF THE INVENTION

The present invention is made in consideration of the foregoing disadvantages. It is an object of the present invention to provide a signal detection circuit in which a malfunction can be prevented while suppressing a deterioration in detection speed and an increase in the area of the circuit.

To accomplish the above object, according to the present invention, there is provided a signal detection circuit for detecting the presence or absence of signals having the same logic in a plurality of arranged signal lines, the circuit including: a first signal transmission line to transmit a first signal indicating the presence of two or more logic signals to be detected, the first signal transmission line including logic circuits; and a second signal transmission line to transmit a second signal indicating the presence of one or more of the logic signals to be detected, the second signal transmission line including logic circuits.

In the signal detection circuit, preferably, the first signal transmission line includes first unit circuits which are connected in series and each of which receives an output of one of the arranged signal lines, and the second signal transmission line includes second unit circuits which are connected in series and each of which receives an output of one of the arranged signal lines.

According to the present invention, there is further provided a signal detection circuit for detecting the presence or absence of signals having the same logic in a plurality of arranged signal lines, the circuit including: first detection circuits each of which is provided for each group obtained by dividing the arranged signal lines into groups in the arrangement order, the first detection circuits including a first signal transmission line to transmit a first signal indicating the presence of two or more logic signals to be detected, and a second signal transmission line to transmit a second signal indicating the presence of one or more logic signal to be detected; and second detection circuits including a third signal transmission line to transmit a third signal indicating that the first signal has been transmitted from any one or more of the first detection circuits or that the second signal has been transmitted from two or more of the first detection circuits, and a fourth signal transmission line to transmit a fourth signal indicating that the second signal has been transmitted from any one of the first detection circuits.

According to the present invention, the signal detection circuit may have the hierarchical structure. For example, in the case of detecting the presence or absence of signals having the same logic indicative of matching, the first signal indicating multi-hit and the second signal indicating hit are transmitted from the first detection circuits to the second detection circuits, and the third signal indicating multi-hit and the fourth signal indicating hit are transmitted from the second detection circuits. Consequently, multi-hit can be detected in a simple circuit structure. The signal detection circuit may include from the most lower hierarchy that receives directly the outputs of arranged signal lines, to the most upper hierarchy that is the total signal detection circuit. The number or depth of hierarchy can be arbitrarily set according to circumstances. As compared with a circuit structure having combinations of AND circuits, wiring design is simplified, the efficiency of layout is increased, and the area of the circuit is small. Accordingly, a malfunction can be prevented while a deterioration in detection speed and an increase in the area of the circuit are being suppressed.

DESCRIPTION OF THE PREFERRED EMBODIMENTS

An embodiment of the present invention will now be described.

Figure 1:
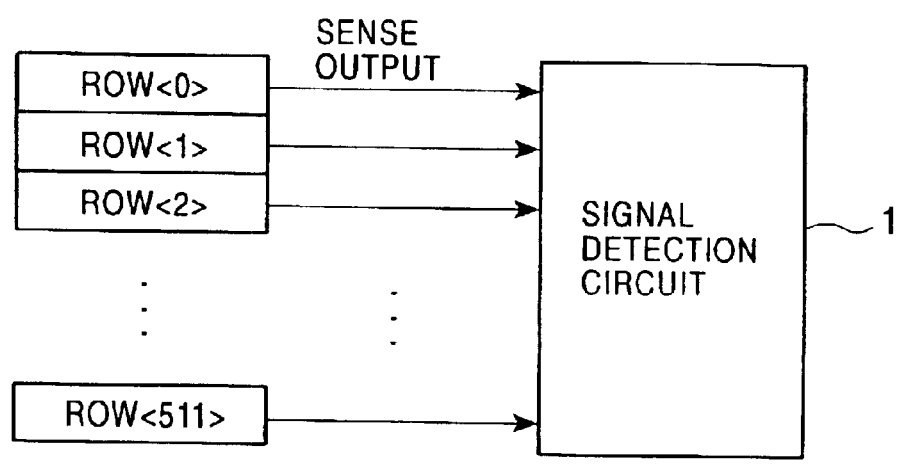
FIG. 1 shows a signal detection circuit built in a CAM, the circuit embodying the present invention.

FIG. 1 shows a signal detection circuit embodying the present invention, the circuit being built in a content addressable memory (CAM).

Referring to FIG. 1, sense outputs of, for example, 512 word match lines ROW<0> to ROW<511> (512 rows)

arranged in the CAM are supplied to a signal detection circuit 1. The signal detection circuit 1 detects the presence or absence of hit flags indicating matching in the 512 match lines ROW<0> to ROW<511>, namely, detects whether it is multi-hit.

Figure 2:
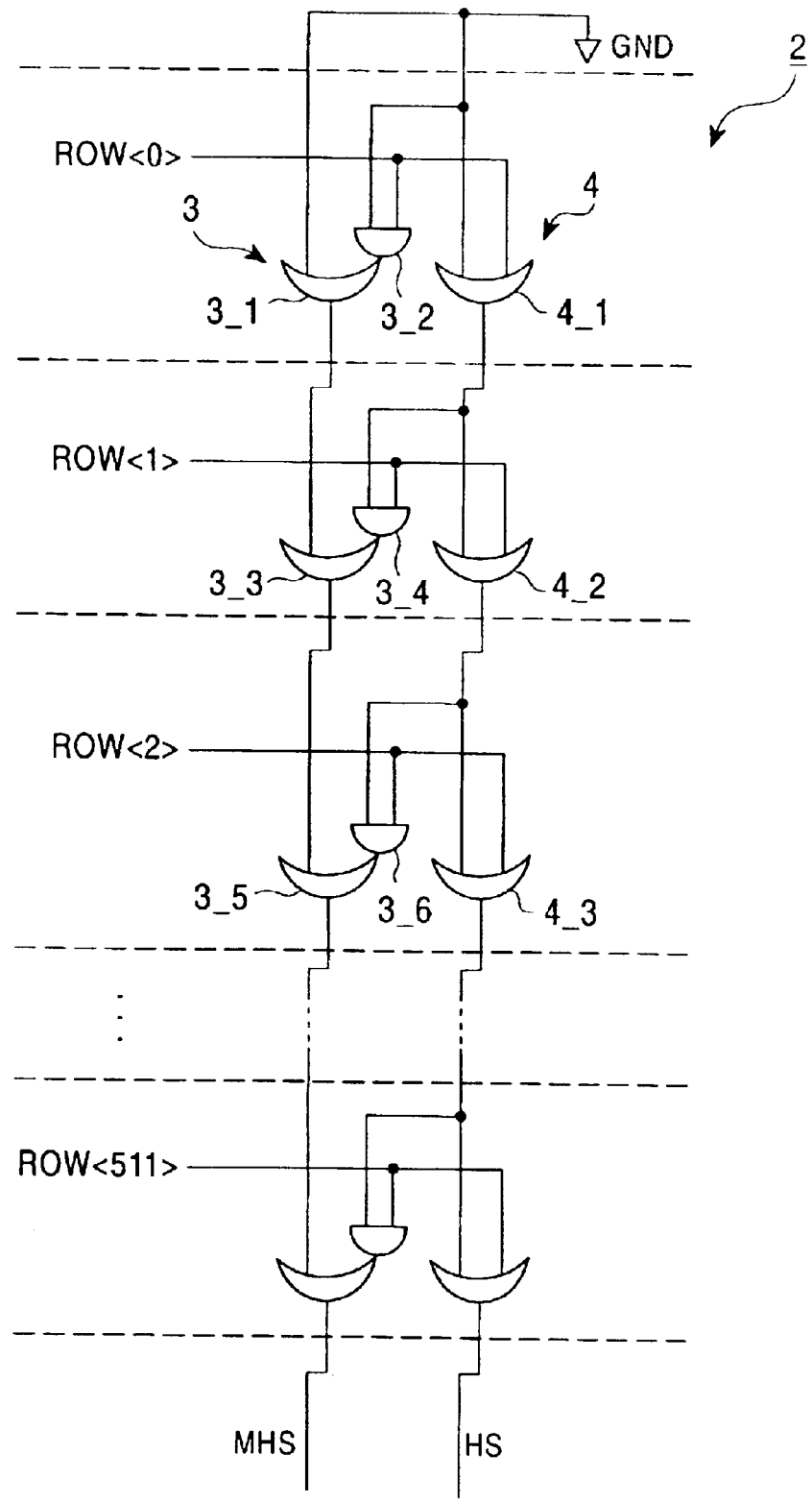
FIG. 2 shows an example of a signal detection circuit of the present invention.

FIG. 2 shows an example of a signal detection circuit of the present invention.

Referring to FIG. 2, sense outputs ROW<0> to ROW<511> of, for example, 512 match lines are supplied to a signal detection circuit 2. In this embodiment, sense output at the level "H" expresses matching and sense output at level "L" expresses mismatching. The signal detection circuit 2 includes a first signal transmission line 3 and a second signal transmission line 4. A multi-hit signal MHS indicating the existence of two or more sense outputs expressing matching is transmitted through the first signal transmission line 3. A hit signal HS indicating the presence of one or more sense outputs indicating matching is transmitted through the second signal transmission line 4.

In the first signal transmission line 3, 512 first unit circuits each comprising a combination of an OR gate 3_2n-1 (n=1,2, . . . , 512) and an AND gate 3_2n are connected in series. In the second signal transmission line 4, 512 second unit circuits each comprising an OR gate 4_n are connected in series. One input of each of the OR gates 3_1 and 4_1 and the AND gate 3_2 is connected to a ground GND. The sense output ROW<0> of the match line is input to the other input of each of the AND gate 3_2 and the OR gate 4_1. An output of the AND gate 3_2 is connected to the other input of the OR gate 3_1. An output of the OR gate 3_1 is input to the next first unit circuit. An output of the OR gate 4_1 is input to the next first unit circuit and the next second unit circuit.

The operation of the signal detection circuit 2 will now be described. When the signal ROW<0> is at the level "L" (in other words, the signal indicates mismatching), the output of the OR gate 4_1 goes to the level "L". When the signal ROW<0> is at the level "H" (namely, the signal indicates matching), the output of the OR gate 4_1 goes to the level "H" to transmit the matching in at least one match line in the second signal transmission line 4 through the subsequent OR gates 4_2, 4_3, . . . On the other hand, on the basis of the logic OR of the output of the preceding first unit circuit and the output of logic AND which receives the output of the preceding second unit circuit (namely, the OR gate) and a sense output of the present match line, a signal indicating matching of two or more match lines is transmitted in the first signal transmission line through combinations each comprising an AND gate 3_2n and an OR gate 3_2n-1 (n is an integer of 1 or larger). Consequently, whether multi-hit has been detected and whether at least one hit has been detected are found using the signals MHS and HS serving as the last outputs.

The present embodiment has explained the case where the sense output of the match line at the level "H" indicates matching. When the sense output of the match line at the level "L" indicates matching, an initial bias potential can be changed from the ground GND to the power supply potential. The structures of the first and second unit circuits are not limited to the above structures. Other arrangements can be used.

According to another embodiment, the signal detection circuit 1 shown in FIG. 1 is hierarchically designed as a multi-hit detection circuit in the CAM. The multi-hit detection circuit having a hierarchical structure will now be described hereinbelow.

Figure 3:
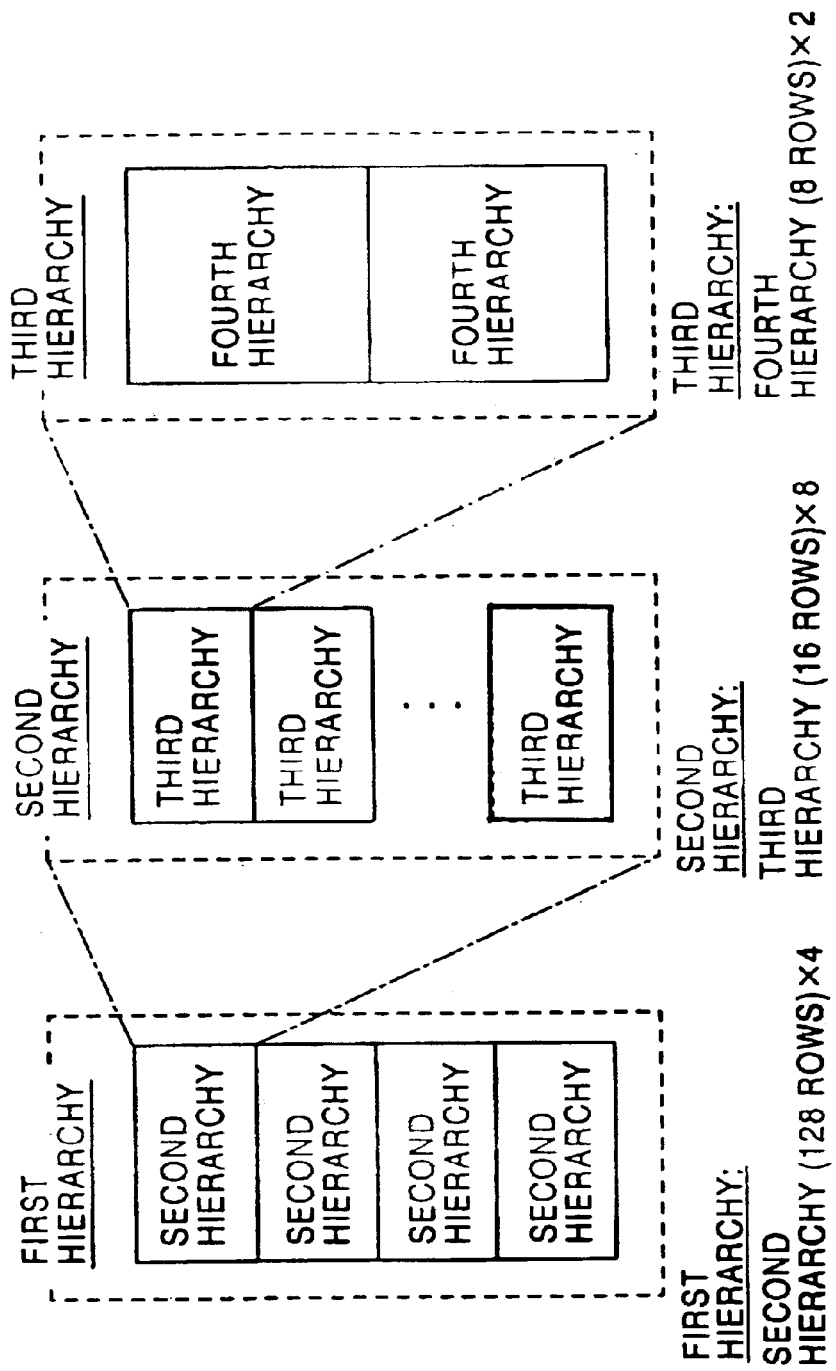
FIG. 3 is a conceptual diagram of the signal detection circuit according to the present invention, the circuit being hierarchically designed.

FIG. 3 is a conceptual diagram showing the hierarchical structure of the signal detection circuit shown in FIG. 1 according to the present invention.

A first hierarchy corresponds to the entire signal detection circuit 1. The first hierarchy is divided into four second hierarchies. Each second hierarchy corresponds to 128 match lines (128 rows) obtained by dividing the 512 match lines arranged in the CAM into four groups in the arrangement order.

Each second hierarchy is divided into eight third hierarchies. Each third hierarchy corresponds to 16 match lines (16 rows) obtained by dividing the 128 match lines, corresponding to the second hierarchy, into eight groups in the arrangement order.

Further, each third hierarchy is divided into two fourth hierarchies. Each fourth hierarchy corresponds to 8 match lines (8 rows) obtained by dividing the 16 match lines, corresponding to the third hierarchy, into two groups in the arrangement order.

Figure 4:
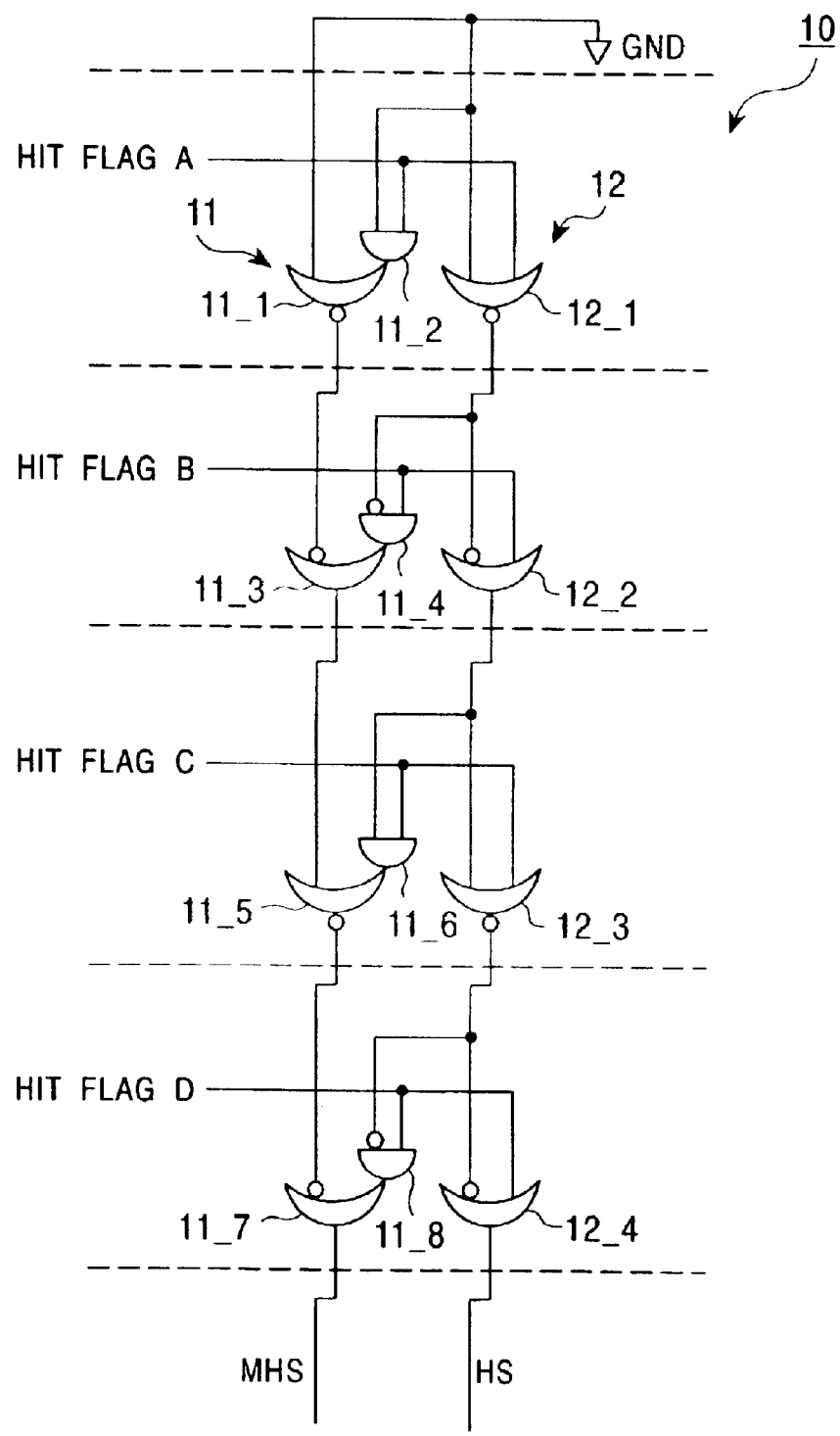
FIG. 4 is a diagram of an upper half of a detection circuit in a fourth hierarchy of the signal detection circuit shown in FIG. 3.

FIG. 4 is a diagram of an upper half of a detection circuit 10 included in each fourth hierarchy in the signal detection circuit shown in FIG. 3.

FIG. 4 shows four unit circuits corresponding to four match lines of the eight match lines in each fourth hierarchy.

The detection circuit 10 in the fourth hierarchy corresponds to a first detection circuit according to the present invention. The detection circuit 10 has a first signal transmission line 11 to transmit a multi-hit signal MHS (corresponding to a first signal according to the present invention) indicating the presence of two or more hit flags (hereinbelow, the hit flag means hit, namely, matching) and a second signal transmission line 12 to transmit a hit signal HS (corresponding to a second signal according to the present invention) indicating the presence of one or more hit flags.

The first signal transmission line 11 includes a combination of a NOR gate 11_1 and an AND gate 11_2, a combination of an OR gate (one inverted input) 11_3 and an AND gate (one inverted input) 11_4, a combination of a NOR gate 11_5 and an AND gate 11_6, and a combination of an OR gate (one inverted input) 11_7 and an AND gate (one inverted input) 11_8. The second signal transmission line 12 includes a NOR gate 12_1, an OR gate (one inverted input) 12_2, a NOR gate 12_3, and an OR gate (one inverted input) 12_4.

One input of each of the NOR gates 11_1, 12_1 and the AND gate 11_2 is connected to the ground GND. A hit flag A is input to the other input of each of the AND gate 11_2 and the NOR gate 12_1. A hit flag B is input to the AND gate 11_4 and the OR gate 12_2. A hit flag C is input to the AND gate 11_6 and the NOR gate 12_3. A hit flag D is input to the AND gate 11_8 and the OR gate 12_4.

The detection circuit 10 comprises the unit circuits which are connected in series. A sense output of the match line is input to each unit circuit. The unit circuits basically operate in a manner similar to the first unit circuits and the second unit circuits in FIG. 2.

In the detection circuit 10, in the case of the presence of two or more hit flags indicating matching, a multi-hit signal MHS at the level "H" is generated from the first signal transmission line 11. When one hit flag exists, a hit signal HS at the level "H" is generated from the second signal transmission line 12.

As mentioned above, the detection circuit 10 includes the first signal transmission line 11 to transmit the multi-hit signal MHS and the second signal transmission line 12 to transmit the hit signal HS. Accordingly, wiring design is simplified to increase the efficiency of layout, resulting in a small space for the detection circuit. Since the detection circuit 10 comprises a logic circuit for determining whether the level of an input is high or low, a malfunction can be prevented.

Figure 5:
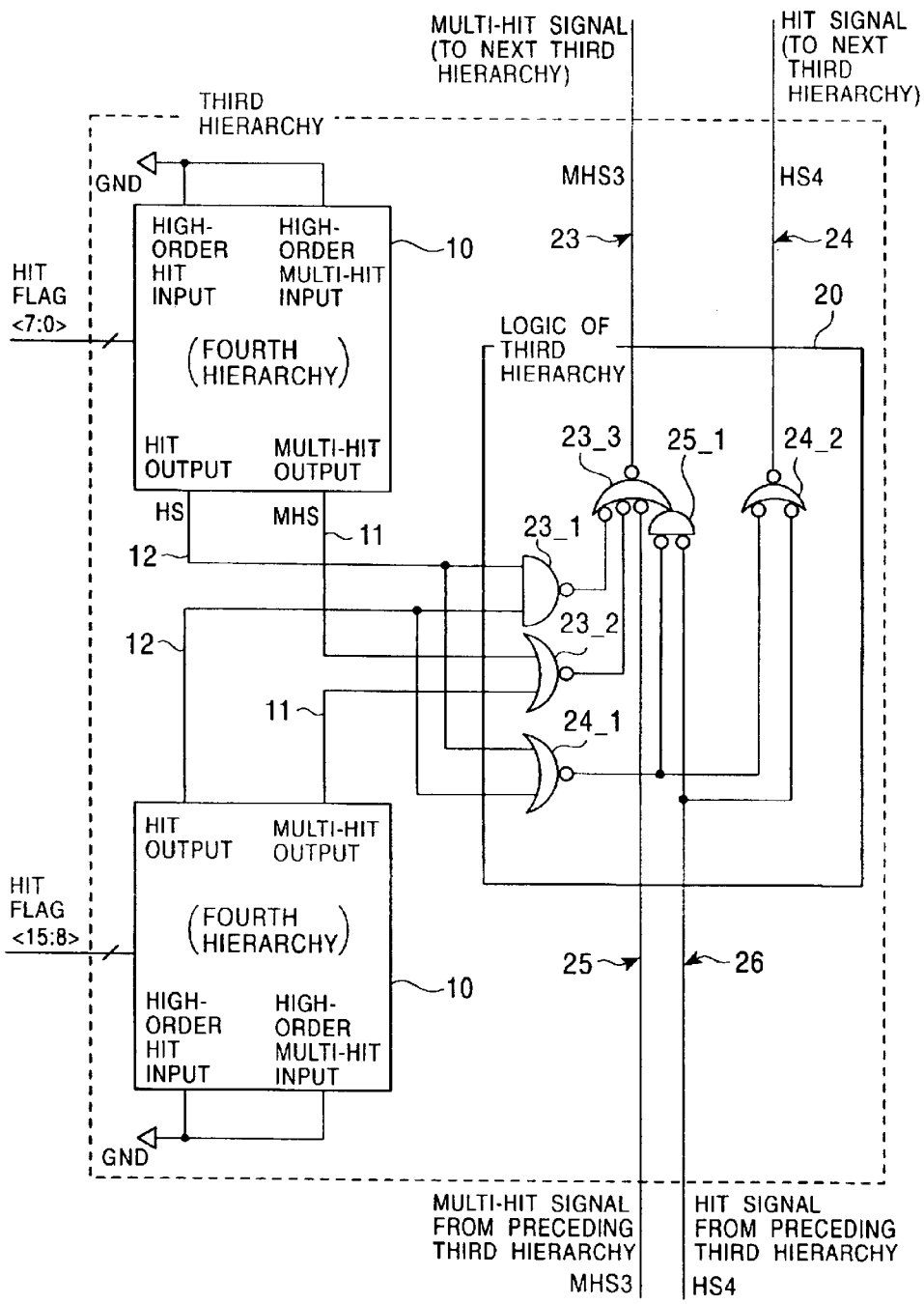
FIG. 5 is a diagram of a detection circuit in a third hierarchy of the signal detection circuit shown in FIG. 3.

FIG. 5 shows a detection circuit in the third hierarchy of the signal detection circuit shown in FIG. 3.

A detection circuit 20 in the third hierarchy corresponds to a second detection circuit according to the present invention. The detection circuit 20 includes a third signal transmission line 23 and a fourth signal transmission line 24.

The third signal transmission line 23 includes a NAND gate 23_1 and NOR gates 23_2 and 23_3. The fourth signal transmission line 24 includes a NOR gate 24_1 and an AND gate 24_2.

In the third signal transmission line 23, a multi-hit signal MHS3 indicating that the multi-hit signal MHS has been transmitted from any one or more of the detection circuits 10 is transmitted to the next third hierarchy through the NOR gates 23_2 and 23_3. Alternatively, a multi-hit signal MHS3 indicating that the hit signal HS has been transmitted from the two detection circuits 10 is transmitted to the next third hierarchy through the NAND gate 23_1 and the NOR gate 23_3.

In the fourth signal transmission line 24, a hit signal HS4 indicating that the hit signal HS at the level "H" has been transmitted from any one of the detection circuits 10 is transmitted to the next third hierarchy through the NOR gate 24_1 and the AND gate 24_2.

In this embodiment, signal MHS at the level "H" means that there exist two or more hit flags indicating matching, and signal HS at the level "H" means that there exist one or more hit flags indicating matching. Therefore, signal MHS3 at the level "L" means that there exist two or more hit flags indicating matching, and signal HS4 at the level "L" means that there exist one or more hit flags indicating matching.

The detection circuit 20 further includes a preceding third signal transmission line 25 and a preceding fourth signal transmission line 26 from the preceding logic of third hierarchy.

The detection circuit 20 further includes a NOR gate 25_1. In the third signal transmission line 23, the fact that the multi-hit signal MHS3 has been transmitted from any one or more of the preceding second detection circuits 20 is transmitted through the NOR gates 23_3. Alternatively, the fact that the hit signal HS4 has been transmitted from two or more of the preceding second detection circuits 20 is transmitted as the multi-hit signal MHS3 through the NOR gates 25_1 and 23_3.

In the fourth signal transmission line 24, the fact that the hit signal HS4 has been transmitted from any one of the preceding second detection circuits 20 is transmitted through the AND gate 24_2.

According to the present invention, as shown in FIG. 5, the first detection circuits 10 are symmetrically arranged so as to be mirror images of each other in each third hierarchy. The second detection circuit 20 serving as a logic circuit of the third hierarchy is disposed so as to correspond to a portion between the two first detection circuits 10 arranged as mentioned above. Accordingly, the efficiency of wiring layout is high, resulting in the high-speed operation.

Figure 6:
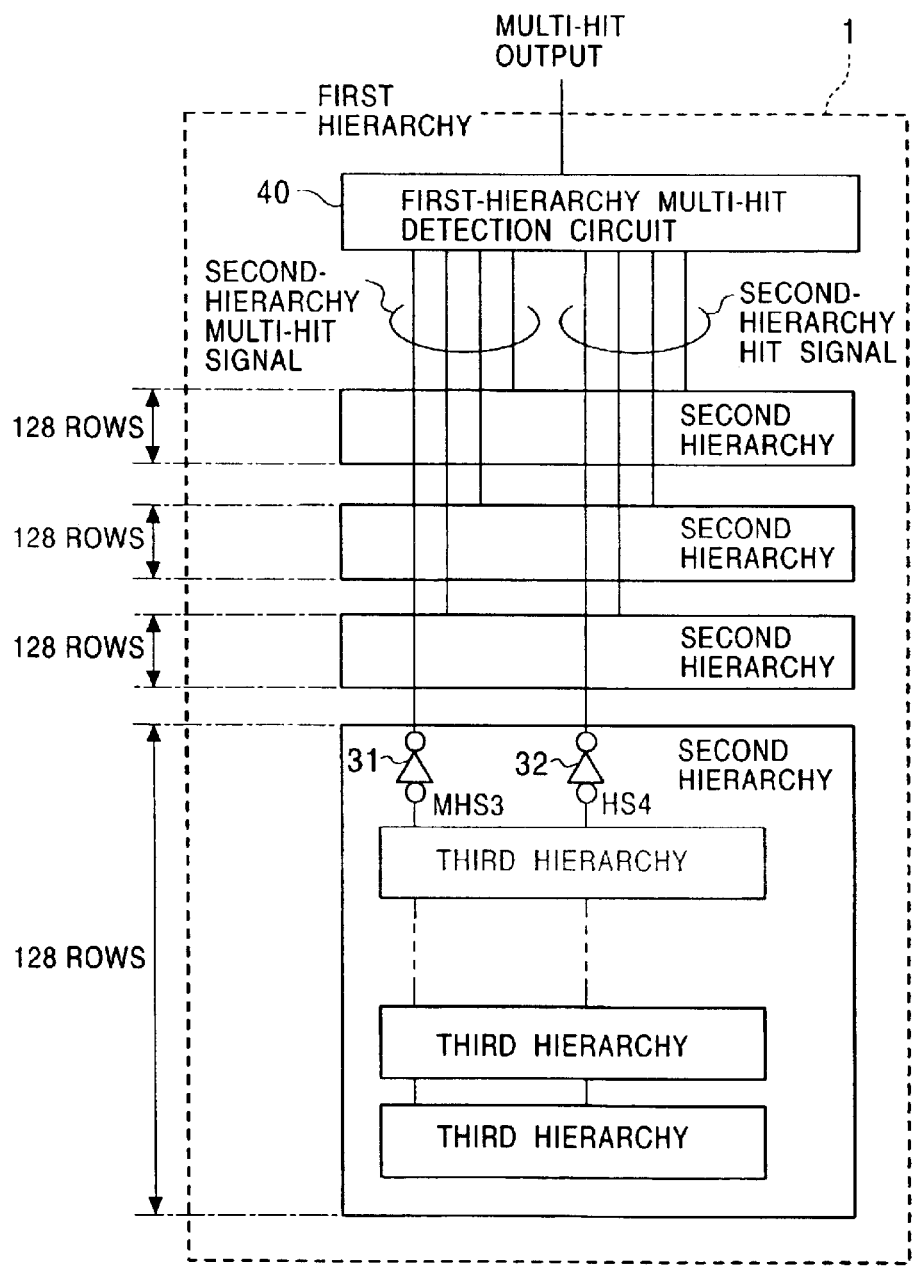
FIG. 6 is a diagram showing the structure of a first hierarchy of the signal detection circuit shown in FIG. 3.

FIG. 6 shows the structure of the first hierarchy in the signal detection circuit shown in FIG. 3.

Referring to FIG. 6, the first hierarchy includes a first-hierarchy multi-hit detection circuit 40 and the four second hierarchies. Each second hierarchy includes buffers 31 and 32. The multi-hit signal MHS3 and the hit signal HS4 generated from the third hierarchy are input to the first-hierarchy multi-hit detection circuit 40 through the buffers 31 and 32.

Figure 7:
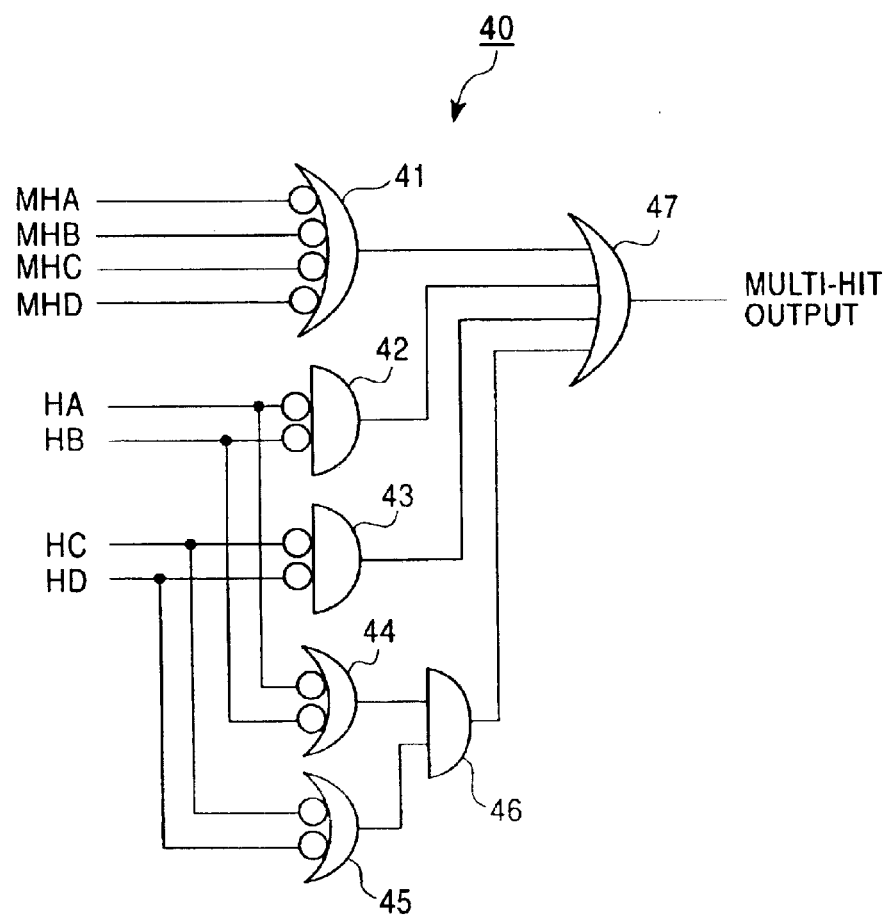
FIG. 7 is a circuit diagram of a first-hierarchy multi-hit detection circuit shown in FIG. 6.
Figure 8:
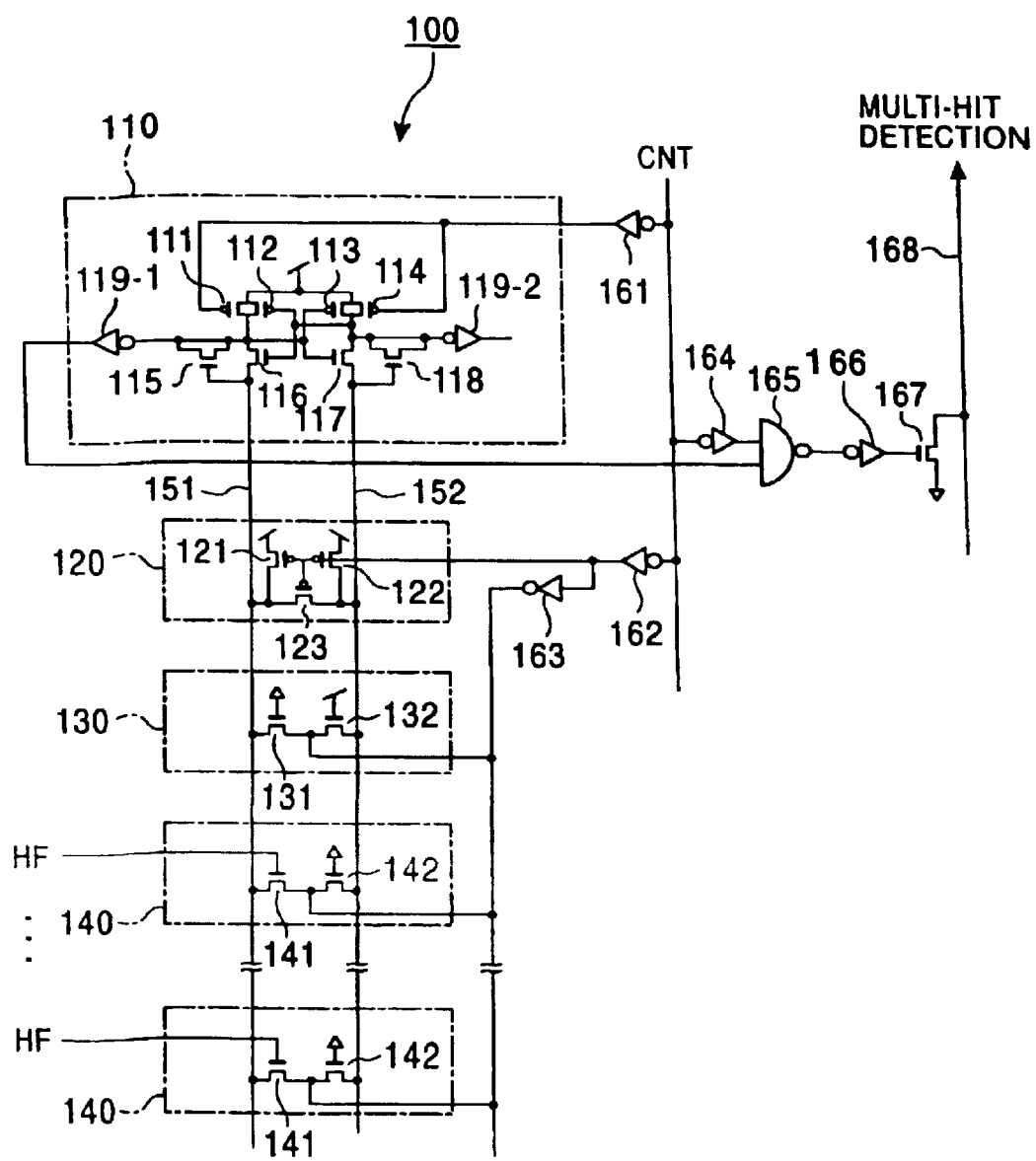
FIG. 8 shows an example of a conventional signal detection circuit.

FIG. 7 is a circuit diagram of the first-hierarchy multi-hit detection circuit 40 shown in FIG. 6.

The first-hierarchy multi-hit detection circuit 40 comprises NAND gates 41, 44, and 45, NOR gates 42 and 43, an AND gate 46, and an OR gate 47.

Multi-hit signals MHA, MHB, MHC, and MHD are supplied as the multi-hit signals MHS3 from the four second hierarchies to the NAND gate 41. Hit signals HA and HB are supplied as the hit signals HS4 from the two second hierarchies to each of the NOR gate 42 and the NAND gate 44. Hit signals HC and HD are supplied as the hit signals HS4 from the two second hierarchies to each of the NOR gate 43 and the NAND gate 45.

When any one or more of multi-hit signals MHS3 at the level "L" are input to the first-hierarchy multi-hit detection circuit 40, a signal at the level "H" indicating the presence of multi-hit is finally generated through the NAND gate 41 and the OR gate 47. Alternatively, when two or more hit signals HS4 at the level "L" are input to the circuit 40, a signal at the level "H" indicating the presence of multi-hit is output therefrom. For example, when the hit signals HA("L") and HB("L") are input, a signal("H") indicating the presence of multi-hit is output through the NOR gate 42 and the OR gate 47. When the hit signals HC("L") and HD("L") are input, a signal("H") indicating the presence of multi-hit is output through the NOR gate 43 and the OR gate 47. Furthermore, when the hit signals HA and HC, or the hit signals HB and HD (each having level "L") are input, a signal("H") indicating the presence of multi-hit is output through the NAND gates 44 and 45, the AND gate 46, and the OR gate 47.

The present embodiment has been described to the case of the signal detection circuit, built in the CAM, for detecting the presence of multi-hit. The present invention is not limited to this case. The signal detection circuit of the present invention can be built in a device other than the CAM. The present invention is not limited to a component for detecting the presence of multi-hit, but may be a circuit for detecting the presence of signals having the same logic in a plurality of arranged signal lines.

As mentioned above, according to the present invention, detection speed can be prevented from deteriorating. Since the logic gates can be formed under the first to fourth signal transmission lines, the efficiency of layout can be increased and a malfunction can be prevented without increasing the area of the circuit.

What is claimed is:

1. A signal detection circuit for detecting the presence or absence of signals having the same logic to be detected in a plurality of arranged signal lines, said circuit comprising:

a first signal transmission line to transmit a first signal indicating the presence of two or more logic signals to be detected, the line including first unit circuits which are connected in series and each of which receives an output of one of the arranged signal lines; and a second signal transmission line to transmit a second signal indicating the presence of one or more of the logic signals to be detected, the line including second unit circuits which are connected in series and each of which receives an output of one of the arranged signal lines.

2. The circuit according to claim 1, wherein
each first unit circuit comprises an AND gate which receives the output of one of the arranged signal lines and an output of the preceding second unit circuit, and an OR gate which receives an output of the AND gate and an output of the preceding first unit circuit, and
each second unit circuit comprises an OR gate which receives the output of said one of the arranged signal lines and the output of the preceding second unit circuit.

3. The circuit according to claim 2, wherein an input of the first unit circuit in the first stage in the first signal transmission line and an input of the second unit circuit in the first stage in the second signal transmission line are set to a level "L" (low).

4. The circuit according to claim 2, wherein an input of the first unit circuit in the first stage in the first signal transmission line and an input of the second unit circuit in the first stage in the second signal transmission line are set to a level "H" (high).

5. A signal detection circuit for detecting the presence or absence of signals having the same logic to be detected in a plurality of arranged signal lines, said circuit comprising:
first detection circuits each of which is provided for each group obtained by dividing the signal lines into a plurality of groups in the arrangement order, the first detection circuits including a first signal transmission line to transmit a first signal indicating the presence of two or more logic signals to be detected, and a second signal transmission line to transmit a second signal indicating the presence of one or more logic signal to be detected; and
second detection circuits including a third signal transmission line to transmit a third signal indicating that the first signal has been transmitted from any one or more of the first detection circuits or that the second signal has been transmitted from two or more of the first detection circuits, and a fourth signal transmission line to transmit a fourth signal indicating that the second signal has been transmitted from any one of the first detection circuits.

6. The circuit according to claim 5, wherein
in the first detection circuits, the first signal transmission line has first unit circuits which are connected in series and each of which receives an output of one of the arranged signal lines, and
the second signal transmission line has second unit circuits which are connected in series and each of which receives an output of one of the arranged signal lines.

7. The circuit according to claim 6, wherein
each first unit circuit comprises an AND gate which receives the output of one of the arranged signal lines and an output of the preceding second unit circuit, and an OR gate which receives an output of the AND gate and an output of the preceding first unit circuit, and
each second unit circuit comprises an OR gate which receives the output of one of the arranged signal lines and the output of the preceding second unit circuit.

8. The circuit according to claim 5, wherein each second detection circuit is provided for each group obtained by dividing the first detection circuits into a plurality of groups.

9. The circuit according to claim 8, further comprising:
third detection circuit for outputting the signal indicating that the third signals has been transmitted from any one or more of the second detection circuits or that the fourth signal has been transmitted from two or more of the second detection circuits.

10. A content addressable memory device comprising:
a signal detection circuit for detecting the presence or absence of signals having the same logic to be detected in a plurality of arranged signal lines, said circuit comprising:
a first signal transmission line to transmit a first signal indicating the presence of two or more logic signals to be detected, the line including first unit circuits which are connected in series and each of which receives an output of one of the arranged signal lines; and
a second signal transmission line to transmit a second signal indicating the presence of one or more of the logic signals to be detected, the line including second unit circuits which are connected in series and each of which receives an output of one of the arranged signal lines.

11. The content addressable memory device according to claim 10, wherein
each first unit circuit comprises an AND gate which receives the output of one of the arranged signal lines and an output of the preceding second unit circuit, and an OR gate which receives an output of the AND gate and an output of the preceding first unit circuit, and
each second unit circuit comprises an OR gate which receives the output of said one of the arranged signal lines and the output of the preceding second unit circuit.

* * * * *